(12) United States Patent
Nishikawa et al.

(10) Patent No.: US 6,521,928 B2
(45) Date of Patent: Feb. 18, 2003

(54) FERROELECTRIC CAPACITOR ARRAY AND METHOD FOR MANUFACTURING FERROELECTRIC MEMORY

(75) Inventors: Takao Nishikawa, Shiojiri (JP); Eiji Natori, Chino (JP); Katsuyuki Morii, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 15 days.

(21) Appl. No.: 09/769,262

(22) Filed: Jun. 28, 2001

(65) Prior Publication Data

US 2001/0050869 A1 Dec. 13, 2001

(30) Foreign Application Priority Data

Jan. 28, 2000 (JP) ........................... 2000-020329
Jan. 26, 2001 (JP) ........................... 2001-018047

(51) Int. Cl.[7] ........................... H01L 29/76; G11C 11/22
(52) U.S. Cl. ................... 257/295; 257/532; 257/534; 438/3; 365/145
(58) Field of Search ................... 365/145; 257/295, 257/532, 534; 438/3

(56) References Cited

U.S. PATENT DOCUMENTS

| | | | | |
|---|---|---|---|---|
| 3,681,766 A | * | 8/1972 | Chapman et al. | 250/214.1 |
| 5,070,026 A | * | 12/1991 | Greenwald | 257/428 |
| 5,316,806 A | * | 5/1994 | Yoshinaga et al. | 347/171 |
| 5,487,031 A | * | 1/1996 | Gnade et al. | 365/145 |
| 5,605,723 A | * | 2/1997 | Ogi et al. | 427/126.3 |
| 5,638,194 A | * | 6/1997 | Yamada et al. | 349/156 |
| 5,822,239 A | * | 10/1998 | Ishihara et al. | 257/295 |
| 5,846,686 A | * | 12/1998 | Kamisawa | 430/197 |
| 5,963,466 A | * | 10/1999 | Evans, Jr. | 257/295 |
| 6,255,157 B1 | * | 7/2001 | Hsu et al. | 257/295 |
| 6,309,896 B1 | * | 10/2001 | Kanehara | 438/3 |

FOREIGN PATENT DOCUMENTS

JP      5-47172     * 2/1993 ........... G11C/11/22

* cited by examiner

*Primary Examiner*—Eddie Lee
*Assistant Examiner*—José R. Díaz
(74) *Attorney, Agent, or Firm*—Oliff & Berridge, PLC

(57) ABSTRACT

The present invention is equipped with a ferroelectric film having concave and convex patterns formed on both sides thereof corresponding to respective electrodes of a plurality of capacitors. A first substrate has first electrodes of the plurality of capacitors formed on one surface thereof. A second substrate has second electrodes of the plurality of capacitors formed on the other surface thereof. First and second anisotropic conduction films are provided between one surface of the ferroelectric film and the first substrate and between the other surface of the ferroelectric film and the second electrode film, respectively, to thereby establish conduction between the convex sections of the ferroelectric film of the capacitors and the electrodes of the capacitors. Since the multiple capacitors can be formed without conducting an etching (lithography) process, damages that may be inflicted on the ferroelectric film when the ferroelectric capacitors are formed can be reduced.

12 Claims, 5 Drawing Sheets

FERROELECTRIC CAPACITOR ARRAY AND METHOD FOR MANUFACTURING FERROELECTRIC MEMORY

BACKGROUND OF THE INVENTION

1. Technical Field of the Invention

The present invention relates to a memory cell structure of a ferroelectric memory, and more particularly to a memory cell structure of a stacked type memory cell and a method for manufacturing the same.

2. Prior Art

In a conventional method of forming a ferroelectric memory cell, for example, in a stacked type memory structure, a capacitor layer of a memory cell array is formed over a semiconductor forming layer that is composed of transistors and wiring layers. For forming capacitors, patterning steps need to be conducted to form a lower electrode layer, a ferroelectric film and an upper electrode layer of the capacitors. The steps are conducted by a lithography technique that includes steps of photoresist coating, pattern exposure and etching. However, when the patterning steps are repeated to form the capacitors, the number of positioning of layers increases and this results in deviations in patterns, in other words, the alignment accuracy lowers. Also, the ferroelectric film is likely to be damaged by the lithography (plasma etching), and the photoresist that is an organic material has a poor separation characteristic with respect to the ferroelectric film that includes an organic material. Furthermore, a higher number of patterning steps results in a higher cost.

SUMMARY OF THE INVENTION

Therefore, it is an object of the present invention to provide a memory cell structure in which capacitor cell arrays can be formed without conducting patterning steps by lithography as much as possible.

In order to achieve the object described above, a ferroelectric capacitor array in accordance with the present invention is equipped with a ferroelectric film having concave and convex patterns formed on both sides thereof that correspond to a plurality of capacitors, a pair of electrodes disposed at locations corresponding to the convex sections of the ferroelectric film, and an anisotropic conduction film that is provided at least between the convex sections of the ferroelectric film and the electrodes to thereby electrically connect the convex sections of the ferroelectric film and the electrodes.

With the structure described above, a large amount of capacitors can be formed without conducting a patterning (lithography) process. As a result, damages to the ferroelectric film can be reduced.

Preferably, the ferroelectric film may be formed by using an original plate (mold) having concave and convex patterns corresponding to a plurality of capacitors and transferring the concave and convex patterns onto a ferroelectric material. With the structure described above, the ferroelectric film can be formed without conducting a patterning (lithography) process. As a result, damages to the ferroelectric film can be reduced.

The ferroelectric capacitor array described above is preferably applicable to ferroelectric memories. Preferably, the pair of electrodes are formed over first and second substrates, respectively. The first and second substrates may include LSI circuits that execute selection, writing, reading and the like of memory cells.

A stacked type memory in accordance with the present invention has a stacked layer including a semiconductor circuit layer in which a semiconductor circuit is formed and a capacitor layer in which capacitors for memory cells are formed. The capacitor layer includes a first electrode film in which one electrodes of a group of the capacitors that form a memory cell array are formed, a ferroelectric film having concave and convex patterns formed on both sides thereof that correspond respectively to the group of the electrodes, a second electrode film in which the other electrodes of the group of the capacitors that form the memory cell array are formed, and first and second anisotropic conduction films that become conductive when a film thickness thereof is smaller than a specified thickness and are provided between the first electrode film and the ferroelectric film and between the second electrode film and the ferroelectric film, respectively. With the structure described above, the ferroelectric film can be formed without conducting a patterning (lithography) process. As a result, damages to the ferroelectric film can be reduced.

A method for manufacturing a ferroelectric memory in accordance with the present invention includes the steps of using an original plate having concave and convex patterns corresponding to capacitors of memory cells to transfer the concave and convex patterns onto a ferroelectric material to thereby form a ferroelectric film having concave and convex sections on at least one surface thereof; stacking a first substrate in which electrodes on one side of the capacitors are formed over one surface of the ferroelectric film through a first anisotropic conduction film; and stacking electrodes on the other side of the capacitors over the other surface of the ferroelectric film.

Preferably, in the step of stacking electrodes on the other side of the capacitors over the other surface of the ferroelectric film, a second substrate in which electrodes on the other side of the capacitors are formed is formed over the other surface of the ferroelectric film through a second anisotropic conduction film.

DETAILED DESCRIPTION OF PREFERRED EMBODIMENTS

Figure 1:
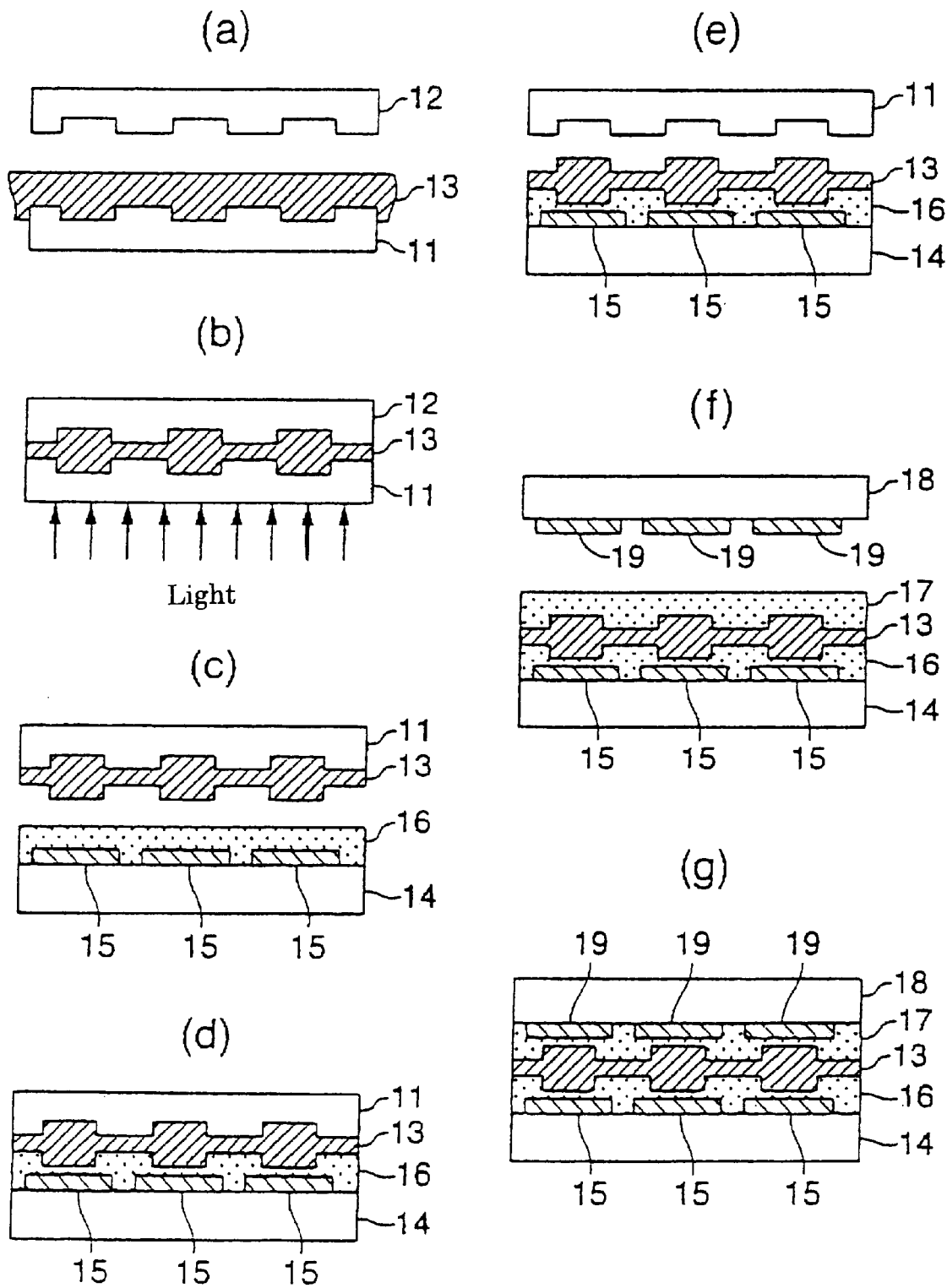
FIG. 1 shows a process chart to describe steps for forming capacitors in accordance with one embodiment of the present invention.

A preferred embodiment of the present invention is described below with reference to the accompanying drawings. FIG. 1 shows a process chart to describe steps for forming a memory cell structure (in a stacked type) in accordance with the present invention.

In the process, an original plate (mold) in which concave and convex patterns are pre-formed according to a capacitor structure is used, and the patterns are transferred onto a ferroelectric film to form the capacitor structure.

First, as shown in FIG. 1(a), original plates 11 and 12 are prepared for forming a capacitor array for memory cells.

Patterns for dielectric members of the capacitor array are etched in the original plates. A ferroelectric material (or, a precursor material) 13 is sandwiched between the original plates, and a pressure may be applied if necessary, whereby the patterns are transferred thereto. Steps for manufacturing the original plates 11 and 12 are described later.

As the ferroelectric material 13, perovskite oxide ferroelectric material, such as lead titanate, lead zirconate titanate and lead zirconate, or organic polymer ferroelectric material, such as bismuth layered oxide material, polyvinylidene fluoride, vinylidene fluoride/trifluoride ethylene copolymer and vinylidene cyanide/vinyl acetate copolymer can be used.

The ferroelectric material (or the precursor material) 13 may preferably be in a liquid form or a material that can be liquefied. When it is in a liquid form, the ferroelectric material can be readily filled in the convex sections of the original plates. For example, when lead zirconate titanate is used as a composition of the ferroelectric film 13, a liquid containing titanium tetra-isopropoxy, tetra-n-proxy zirconium and lead acetate mixed in an organic solvent, such as 2-n-butoxyethanole and diethanoleamine is used.

Also, for example, when organic polymer ferroelectric material is used as the ferroelectric material 13, it may preferably be energy hardening material or thermoplastic material.

Such materials provide strong ferroelectric films. Therefore, when the ferroelectric films are separated from the original plates, as described below, damages to the ferroelectric films can be prevented. At least one of light and heat may preferably be used as energy when the energy hardening material is used.

By using light or heat, a heating apparatus, such as a general-purpose exposure apparatus, a baking furnace or a hot plate can be used, and therefore the facility can be simplified.

As shown in FIG. 1(b), the ferroelectric material 13 is shaped by the original plates 11 and 12. For example, the regional plates 11 and/or 12 may be made from a transparent crystal, and light is irradiated from outside to harden the material, as described below. When a thermoplastic material is used, it is heated at an appropriate temperature. The patterns on the original plates 11 and 12 are transferred onto the ferroelectric film 13. The original plate 12 is removed after the ferroelectric film 13 hardens.

As shown in FIG. 1(c), an anisotropic conduction film material 16 is formed over an LSI substrate 14 in which transistors (not shown), wiring layers (not shown), and electrode layers 15 are formed by a spin-coat method or the like. As described below with reference to FIG. 2, the anisotropic conduction film 16 has a characteristic in which its insulation property changes to a conductive property when the film becomes thin.

For example, the anisotropic conduction film 16 is provided as follows. PMMA is resolved in tetrahydrofuran (THF) to form a solution, which is then mixed with polypyrrols dissolved in tetrahydrofuran. The ratio between PMMA and polypyrrols is, for example, 20~70%. As a solvent other than the above-described tetrahydrofuran, chloroform, dichloromethane or the like can be used. The mixed solution is coated over the electrodes and wiring layers 15 of the substrate 14 by, for example, a spin-coat method, and then heated at temperatures of 100~170° C. to remove tetrahydrofuran.

As shown in FIG. 1(d), the original plate 11 is turned over, and, while adjusting the position thereof with respect to the substrate 14, the ferroelectric film 13 and the anisotropic conduction film 16 are closely bonded together. The anisotropic conduction film 16 (i.e., 16' to be described below with reference to FIG. 2) becomes conductive at areas between downwardly extending convex sections on a lower side of the ferroelectric film 13 and the electrode layers 15 because the film thickness of the anisotropic conduction film 16 becomes thin at these areas. Also, the anisotropic conduction film 16 functions as a binder between the ferroelectric film 13 and the electrode layers 15.

Next, as shown in FIG. 1(e), the original plate 11 on the upper side of the ferroelectric film 13 is removed.

As shown in FIG. 1(f), an anisotropic conduction material 17 that is similar to the anisotropic conduction material 16 is coated over the ferroelectric film 13 by, for example, a spin-coat method, to form an anisotropic conduction film 17.

As shown in FIG. 1(g), an upper substrate 18 in which electrode layers 19 are formed on a lower surface thereof by an independent process is aligned with the lower side substrate 14, such that the ferroelectric film 13 is sandwiched between the substrates to thereby closely bond the electrode layers 19 and the anisotropic conduction film 17. The anisotropic conduction film (17' to be described below with reference to FIG. 3) becomes conductive at areas between upwardly extending convex sections of the ferroelectric film 13 and the electrode layers 19 because the film thickness of the anisotropic conduction film 17 becomes thin at these areas. Also, the anisotropic conduction film 17 functions as a binder between the electrode layers 19 and the ferroelectric film 13. As a result, portions of the ferroelectric film 13, which are interposed between the electrodes 15 (the anisotropic conduction film 16') and the electrodes 19 (the anisotropic conduction film 17'), function as capacitors.

In this manner, the ferroelectric film 13 is patterned, without using a lithography technique, to thereby make electrical contact with the electrode layers, whereby ferroelectric memories with the capacitor array disposed on the LSI substrate 14 can be formed.

Once the electrode layers 19 and the like formed on the lower surface of the upper substrate 18 are closely bonded through the anisotropic conduction film 17 to the ferroelectric film 13, depending on the structure of the ferroelectric memory device, the upper side substrate 18 itself can be removed in a similar manner as the aforesaid original plate was removed. Then, in such a case, functional devices and semiconductor layers formed by independent processes can be further disposed over the electrode layers 19.

Figure 2:
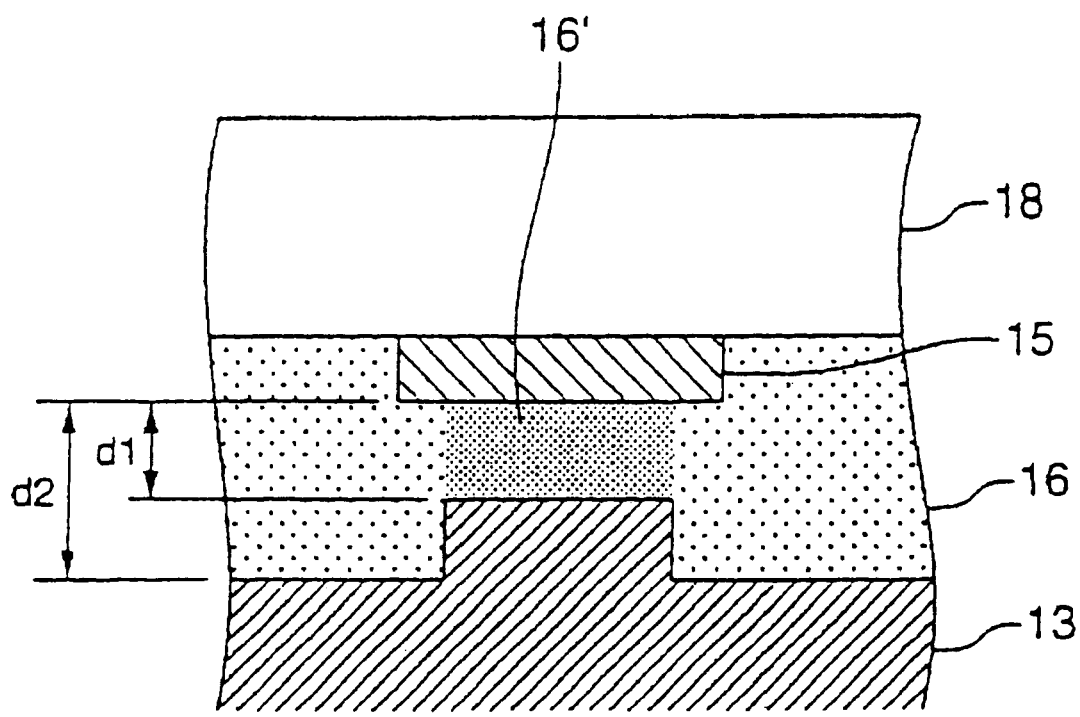
FIG. 2 shows an illustration to describe an anisotropic conduction film.
Figure 3:
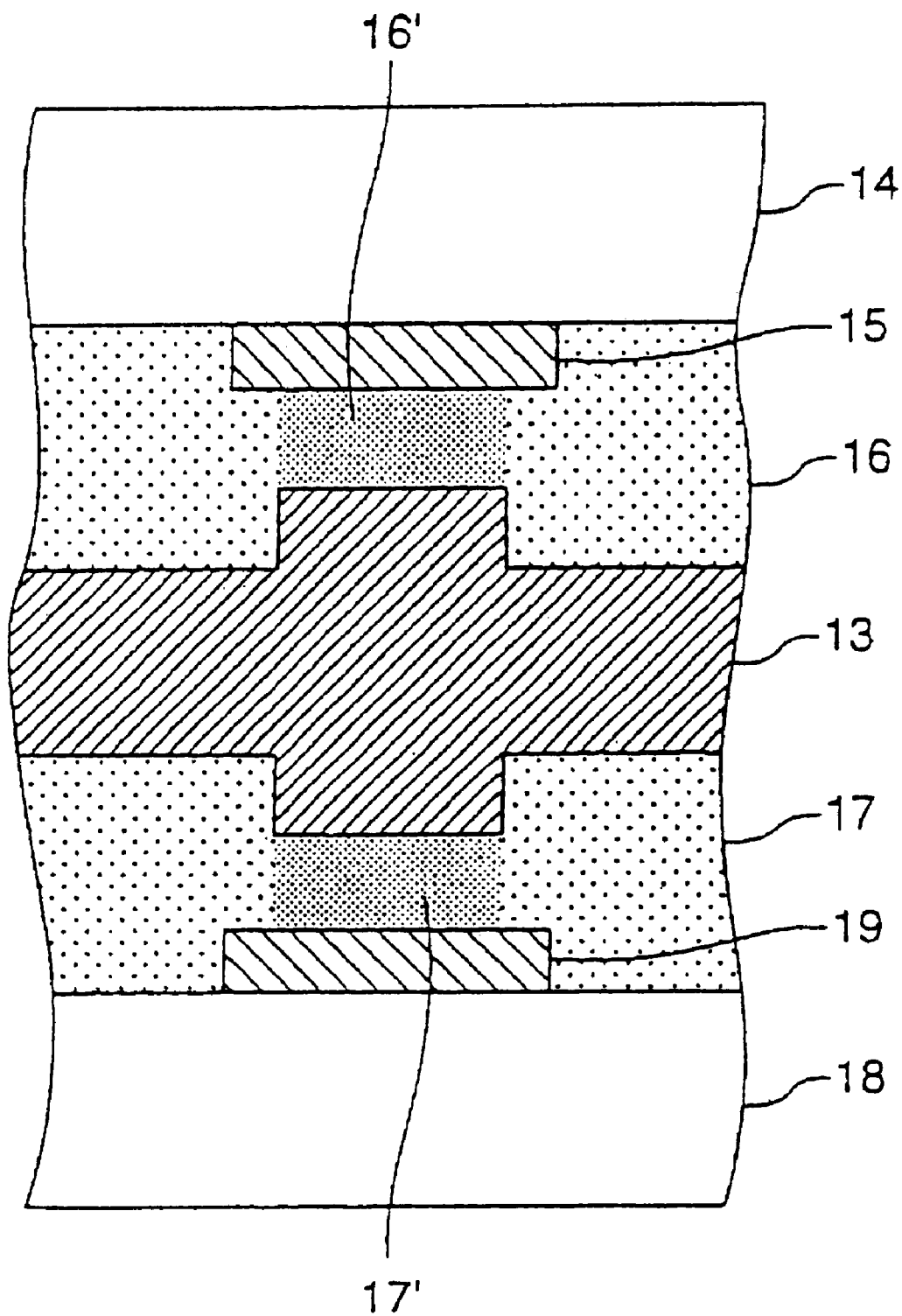
FIG. 3 shows an illustration to describe a capacitor structure using an anisotropic conduction film.

FIGS. 2 and 3 are illustrations to describe functions of the anisotropic conduction film 16. In both of the figures, the substrates 14 and 18 are shown upside down with respect to FIG. 1 for the convenience of description.

As shown in FIG. 2, the anisotropic conduction film 16 is sandwiched between the ferroelectric film 13 and the electrode layers 15. In this instance, the film thickness of the anisotropic conduction film is set such that the film becomes conductive at a thickness d1 and nonconductive at a thickness d2 shown in FIG. 2. As a result, the ferroelectric film and the electrode layer become electrically conductive only at a region 16' of the anisotropic conduction film. As a result, the ferroelectric film and the electrode layer become conductive only at the region 16' of the anisotropic conduction film.

Furthermore, as shown in FIG. 3, the anisotropic conduction film 17 is sandwiched between the ferroelectric film 13 and the electrode layer 19. The film thickness of the sandwiched section 17' becomes small and thus conductive. Non-sandwiched sections of the anisotropic conduction film 17 are dielectric. As a result, the electrode 15, the anisotropic conduction film 16, the ferroelectric film 13, the anisotropic conduction film 17 and the electrode 19 form a capacitor. The capacitor plays a role of retaining information in a memory cell.

Figure 4:
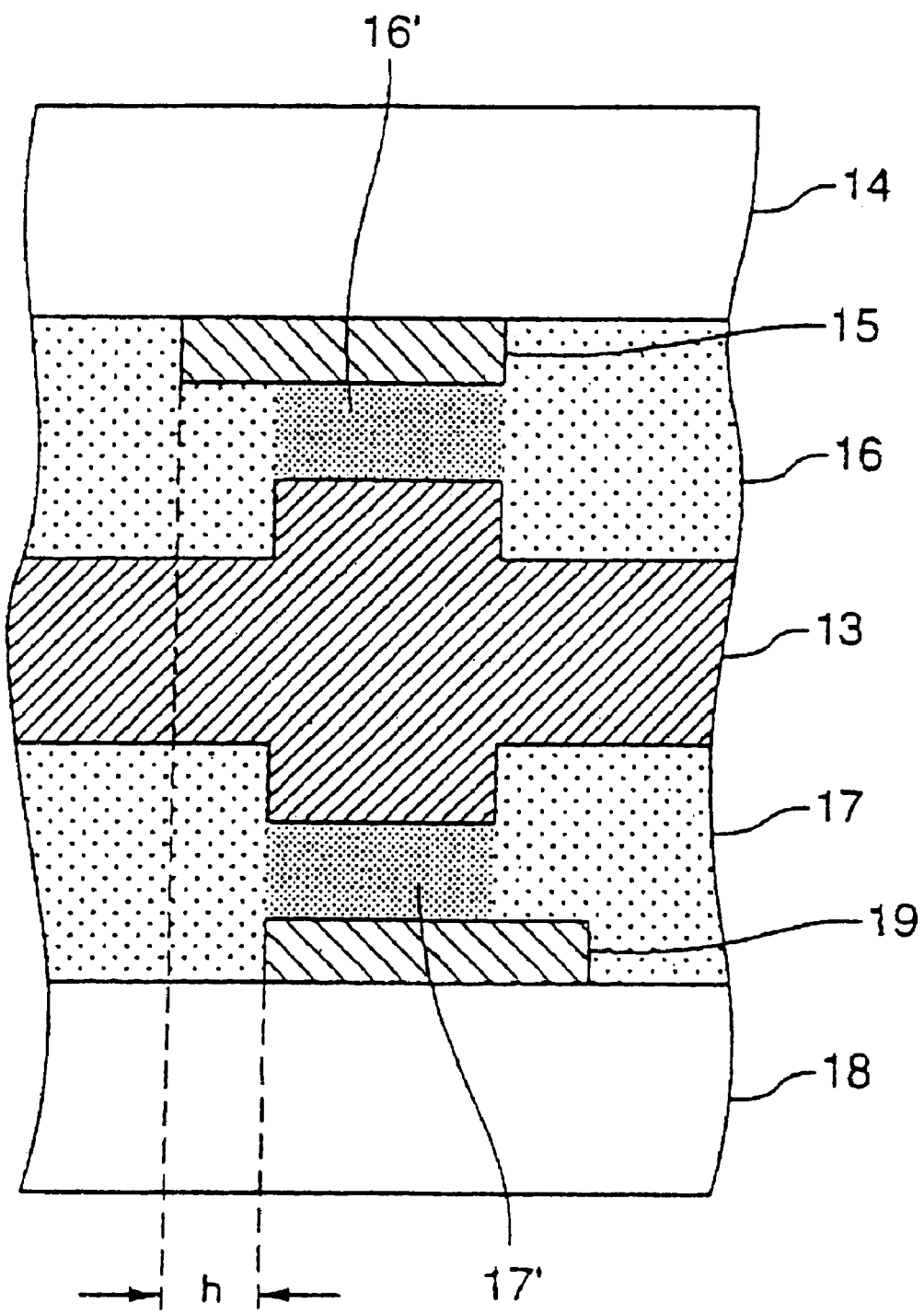
FIG. 4 shows an illustration to describe other advantages derived when an anisotropic conduction film is used.

FIG. 4 shows an illustration to describe other advantages derived when an anisotropic conduction film is used. In the figure, sections corresponding to those shown in FIG. 3 are indicated by the same reference numbers, and their description is omitted.

When an anisotropic conduction film is used, even when there is a slight offset h between the upper and lower electrode layers (or terminals) 15 and 19, as shown in FIG. 4, the electrical contact can be maintained between the sandwiched regions 16' and 17'. As a result, electrical connection between electrodes (or terminals or the like) can be readily secured in a higher integration.

FIGS. 5(a) through 5(e) show one example of steps for manufacturing the original plates 11 and 12.

Figure 5:
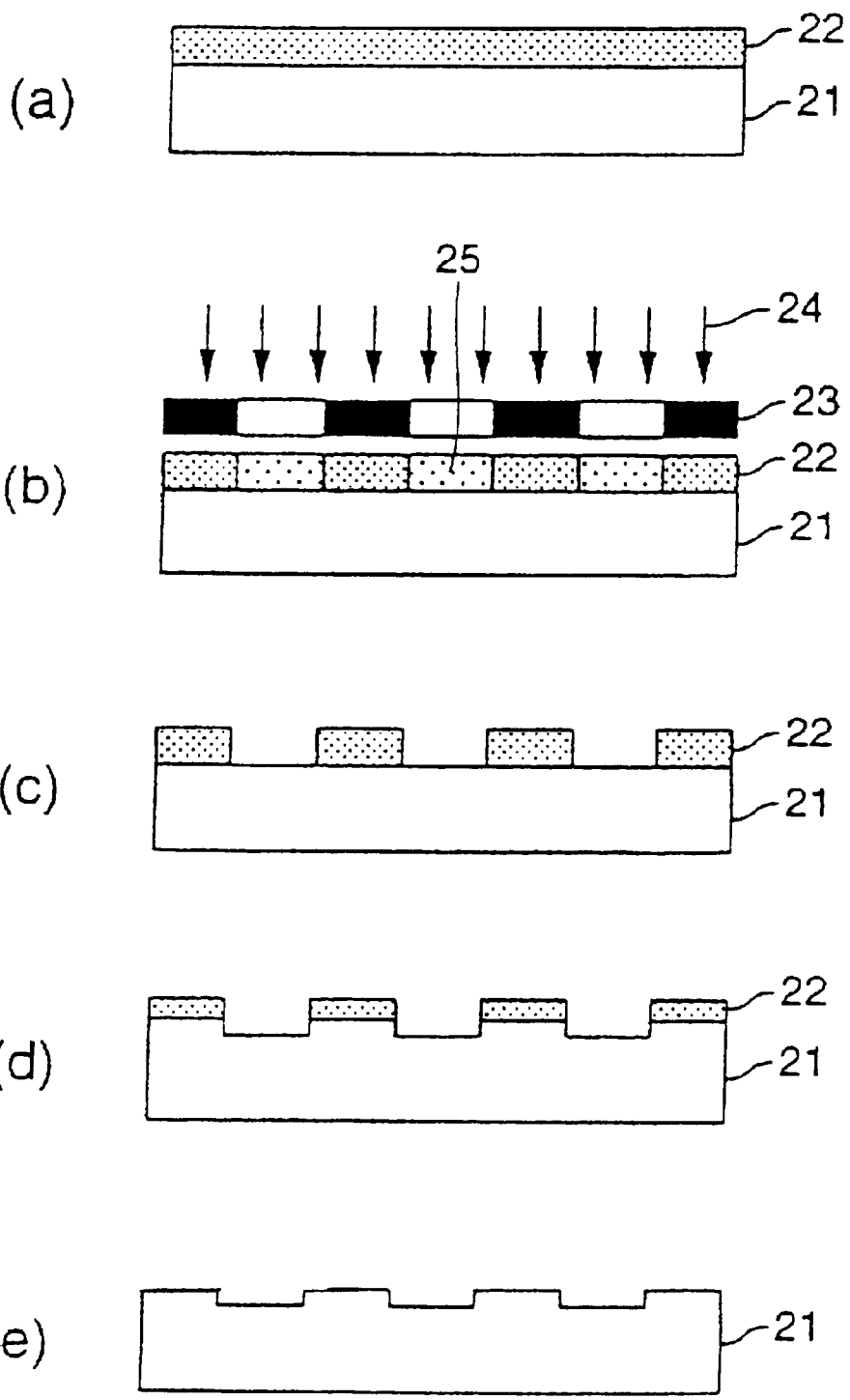
FIG. 5 shows a process chart to describe steps for manufacturing an original plate.

As shown in FIG. 5(a), a resist layer is formed over a substrate 21. The substrate 21 may be formed from any material that can be etched, and is not limited to a specific material. However, at least portions that are etched may preferably be formed from silicon or a compound thereof. Silicon or a compound thereof is preferred because it is easy to form convex sections by etching with high accuracy. When a light-transmissible original plate is desired, quartz may preferably be used as a substrate composition material. Quartz is preferred because it is easy to form convex sections by etching with high accuracy.

The resist layer may be formed from a positive type resist that can be obtained by, for example, mixing diazonaphthoquinone derivative as a photosensitive material in cresolnovolac resin. The positive type resist is a material that is, when a radiation energy ray such as light is irradiated according to a specified pattern, portions exposed to the irradiated energy ray can be selectively removed by developing solution. The resist layer may be formed by a method including, for example, a spin-coat method.

Next, as shown in FIG. 5(b), a radiation energy ray 24 is irradiated only at specified regions of the resist layer 22 through a mask (reticle) 23. The mask 23 is formed with patterns that transmit the radiation energy ray 24 only at the regions required to form concave sections in the original plate at locations corresponding to capacitors.

After the irradiation energy ray 24 is irradiated onto the resist layer 22, a developing process is conducted under predetermined conditions. As a result, as shown in FIG. 5(c), portions of the resist layer 22 are selectively removed and the surface of the substrate 21 is exposed only at regions 25 that are exposed to the irradiation energy ray 24 and regions other than the exposed regions remain covered by the resist layer 22.

When the resist layer 22 is patterned, the substrate 21 is etched to a specified depth using the resist layer 22 as a mask, as shown in FIG. 5(d). The etching may be conducted by a wet etching method or a dry etching method, and an optimum method and conditions may be selected in view of the material of the substrate 21, etching configuration, etching rate, inner-plane uniformity, and the like. In view of the working accuracy, a dry etching method is superior, and may be performed by an apparatus employing, for example, a parallel flat-plate type reactive ion etching (RIE) method, an inductive coupling type (ICP) method, an electron cyclotron resonation (ECR) method, a helicon wave excitation method.

After the etching is completed, the substrate 21 is washed, such that the patterns corresponding to the capacitor electrodes are formed on the original plate 11 as shown in FIG. 5(e).

The original plate 12 can be manufactured by the same steps as those described above. In accordance with the present embodiment, once the original plates 11 and 12 are manufactured, they can be repeatedly used as long as their durability permits, and therefore economical.

In accordance with the embodiments of the present invention, a ferroelectric film can be patterned without conducting a lithography process. As a result, damages to the ferroelectric film that may be caused by plasma etching or etching solutions can be reduced. Also, since the number of positioning for patterning steps is reduced, deterioration of the alignment accuracy due to pattern deviations is reduced.

In the embodiment described above, a solution formed by mixing one conduction polymer and one dielectric polymer is used. However, a solution using one or more conduction polymer materials and a solution using one or more dielectric polymer materials can be mixed and used as an anisotropic conduction film. In addition to the above-described polymetacrylate (PMMA), other dielectric polymers, such as polyesters, polycarbonates, polyacrylates, polyolefines, polystyrenes may be used. In addition to the above-described polypyrrol, other conduction polymers, such as polyaniline, polythiophenes, polythiophenvinylenes may be used.

In the embodiment described above, convex and concave sections are formed on both surfaces of a ferroelectric film, and anisotropic conduction films are formed between electrodes and the convex and concave sections on both sides of the ferroelectric film. However, convex and concave sections may not necessarily be formed on both sides of the ferroelectric film, but may be formed on at least one surface thereof, to obtain the effects that are provided by the ferroelectric capacitor array and the method of manufacturing ferroelectric memories in accordance with the present the invention.

In other words, an original plate (mold) having convex and concave patterns corresponding to a plurality of capacitors is used to transfer the concave and convex patterns onto a ferroelectric material to form a ferroelectric film. As a result, the ferroelectric film can be formed without conducting an etching (lithography) process, and thus damages to the ferroelectric film can be reduced. Therefore, even though convex and concave sections and anisotropic conduction films may preferably be formed on both surfaces of the ferroelectric film, they can be formed only on one surface thereof. By doing so may reduce damages to the ferroelectric film more than the case where they are formed on both of the surfaces.

What is claimed is:

1. A ferroelectric capacitor array, comprising:
   a ferroelectric film having first and second sides, concave and convex patterns being formed on the first and second sides corresponding to a plurality of capacitors;
   a pair of electrodes disposed corresponding to the convex patterns of the ferroelectric film; and
   an anisotropic conduction film that is provided at least between the convex patterns of the ferroelectric film and the electrodes to electrically connect the convex patterns of the ferroelectric film and the electrodes.

2. The ferroelectric capacitor array according to claim 1, the ferroelectric film being formed by using an original plate having concave and convex patterns corresponding to the plurality of capacitors, and transferring the concave and convex patterns onto a base ferroelectric material.

3. The ferroelectric capacitor array according to claim 2, the original plate being manufactured by forming a resist layer having a specified pattern over a substrate, and then forming concave and convex patterns on the substrate by etching.

4. The ferroelectric capacitor array according to claim 3, at least portions of the substrate that are etched being formed from at least one of a silicon and a compound of silicon.

5. The ferroelectric capacitor array according to claim 3, the substrate being formed from quartz.

6. The ferroelectric capacitor array according to claim 1, the ferroelectric material including a material that is capable of hardening by application of energy.

7. The ferroelectric capacitor array according to claim 6, the energy being at least one of light and heat.

8. A ferroelectric memory that includes the ferroelectric capacitor array according to claim 1.

9. The ferroelectric memory according to claim 8, further including an LSI circuit formed in at least one of a first substrate and a second substrate provided such that the ferroelectric film is sandwiched in between via the anisotropic conduction film.

10. A stacked type memory, comprising:
   a stacked layer including:
   a semiconductor circuit layer;
   a semiconductor circuit formed in the semiconductor circuit layer;
   a capacitor layer; and
   capacitors for memory cells being formed in the capacitor layer,
   the capacitor layer including:
      a first electrode film in which first electrodes of a group of the capacitors that form a memory cell array are formed;
      a ferroelectric film having first and second sides, concave and convex patterns formed on the first and second sides that correspond respectively to the first electrodes;
      a second electrode film in which second electrodes of the group of the capacitors that form the memory cell array are formed; and
      first and second anisotropic conduction films that become conductive when a film thickness thereof is smaller than a specified thickness, the first and second anisotropic conduction films being provided between the first electrode film and the ferroelectric film and between the second electrode film and the ferroelectric film, respectively.

11. A method for manufacturing a ferroelectric memory, comprising the steps of:
   using an original plate, having concave and convex patterns corresponding to capacitors of memory cells, to transfer the concave and convex patterns onto a ferroelectric material, to thereby form a ferroelectric film having concave and convex sections on at least one surface thereof;
   stacking a first substrate, in which electrodes on one side of the capacitors are formed, over one surface of the ferroelectric film through a first anisotropic conduction film; and
   stacking electrodes on another side of the capacitors over another surface of the ferroelectric film.

12. The method for manufacturing a ferroelectric memory according to claim 11, the step of stacking electrodes on the other side of the capacitors over the other surface of the ferroelectric film includes forming a second substrate, in which electrodes on the other side of the capacitors are formed, over the other surface of the ferroelectric film through a second anisotropic conduction film.

* * * * *

UNITED STATES PATENT AND TRADEMARK OFFICE
CERTIFICATE OF CORRECTION

| | | |
|---|---|---|
| PATENT NO. | : 6,521,928 B2 | Page 1 of 1 |
| DATED | : February 18, 2003 | |
| INVENTOR(S) | : Takao Nishikawa and Eiji Natori | |

It is certified that error appears in the above-identified patent and that said Letters Patent is hereby corrected as shown below:

<u>Title page,</u>
Item [22], please change "[22]   Filed: Jun. 28, 2001" to -- [22]   Filed: Jan. 26, 2001 --

Signed and Sealed this

Second Day of September, 2003

JAMES E. ROGAN
*Director of the United States Patent and Trademark Office*